May 13, 1958 R. S. BRIGGS 2,834,916

TUNING MEMBER FOR TUNABLE MAGNETRON DEVICES

Filed Aug. 28, 1956

INVENTOR.
RICHARD S. BRIGGS
BY Edgar O. Rost
ATTORNEY

United States Patent Office 2,834,916

Patented May 13, 1958

2,834,916

TUNING MEMBER FOR TUNABLE MAGNETRON DEVICES

Richard S. Briggs, Beverly, Mass., assignor to Bomac Laboratories Inc., Beverly, Mass., a corporation of Massachusetts Application August 28, 1956, Serial No. 606,722

5 Claims. (Cl. 315—39.61)

The present invention relates to electron discharge devices of the magnetron type and more particularly to an improved tuning member for tuning such devices over a selected band of microwave frequencies.

Prior art magnetrons employing the capacitive method of tuning are described in the text "Microwave Magnetrons," vol. 6, Radiation Laboratory Series, McGraw-Hill Book Co., Inc., New York 1948 at pages 570 to 575. Generally this method utilizes the introduction of a metallic member between circular straps which are joined to the anode resonant cavity vanes to thereby vary the capacitance between the straps. Since a very small spacing exists between the metallic member and adjacent strap structure, close tolerances and care in assembly must be observed. In applications involving high shock and vibration requirements this tuning method is limited by the possibility of shorting between the closely spaced metallic components.

It is, therefore, an object of the present invention to provide a tuning member for a capacitively-tuned magnetron which is capable of withstanding extremely high shock and vibration conditions.

A further object is to provide a non-metallic tuning member for capacitively-tuned magnetrons.

A still further object is to provide a tuning member of a non-conductive material having a high dielectric constant to thereby improve operating characteristics over prior art devices as well as affording performance capabilities heretofore unattainable.

In specific embodiments employing the so-called "cookie-cutter" type of capacitive tuning arrangement, the anode assembly incorporates a plurality of metallic vanes joined at their inner ends by spaced straps defining therebetween a capacitance. The introduction of the tuning member between the straps alters the resonant circuit capacitance to thereby vary the operating bandwidth. Metallic tuning members require extremely close tolerances and are generally supported at a distance from the critical anode region which results in a cantilever effect upon normal vibration. However, under operating conditions of high shock and vibration, such prior art tuning members have proven to be unsatisfactory.

The present invention overcomes these disadvantages by incorporating a tuning member of a non-conductive material preferably having a high dielectric constant such as a ceramic insulating material. Such a tuning member enhances the capacitance between the parallel spaced metallic straps as opposed to the prior art arrangement wherein only a small air gap is present on each side of the metal member and adjacent strap. The improved tuning member has eliminated any shorting possibilities and in several embodiments has resulted in a wider tuning range. Furthermore, with the use of the dielectric tuning member, unequal capacitances between the prior art metallic member and each anode strap are eliminated thereby preventing any unbalance in the electrical symmetry of the anode.

The foregoing advantages, features and objects will be evident after consideration of the following detailed description and reference of the accompanying drawing, in which.

Figures 1, 2, 3:
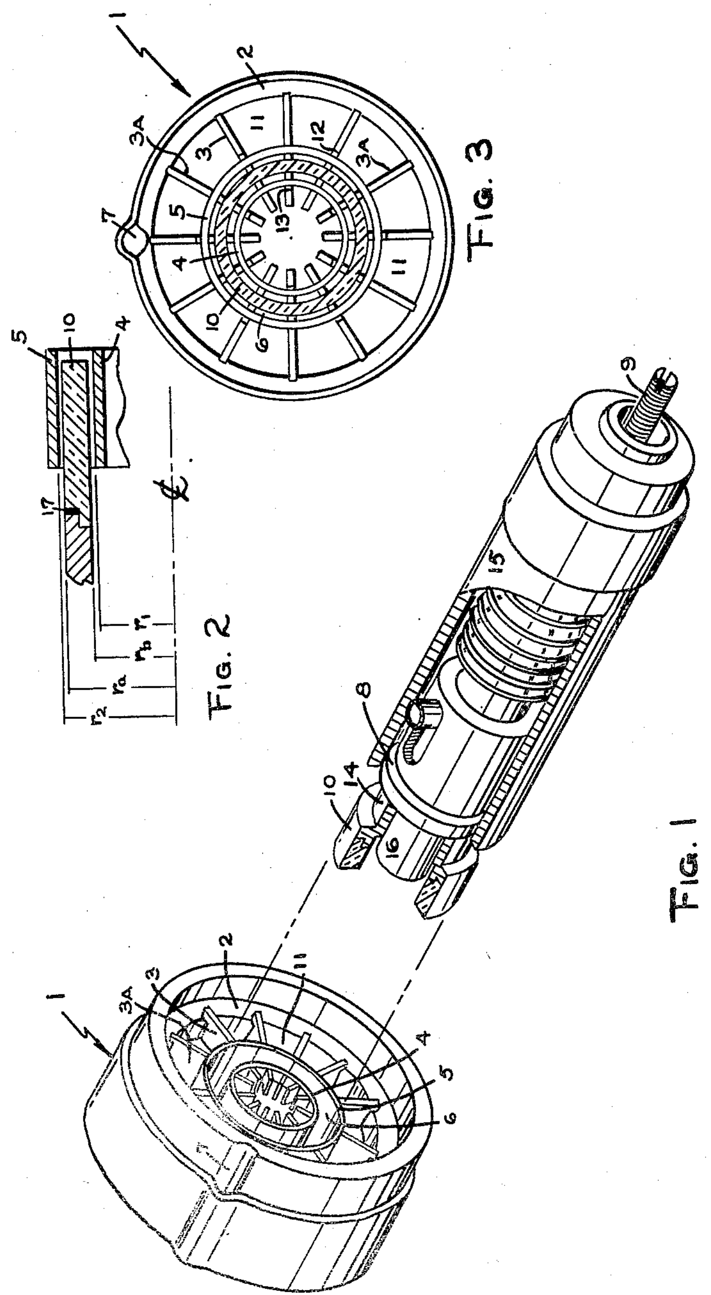
Figure 1 is a perspective view partially in section of the so-called "cookie-cutter" tuning arrangement illustrative of an embodiment of the present invention.
Figure 2 is a cross-sectional fragmentary view of a portion of the anode member strap means with the capacitive tuning member of the invention positioned therein.
Figure 3 is a plan view of the complete anode member showing the relative positions of the straps and tuning member of the present invention.

Magnetrons employing the capacitive method of tuning referred to as the "cookie-cutter" are well known in the art. Therefore, all structure such as magnets, cathode, cooling fins etc. has been omitted to facilitate a more comprehensive understanding of the invention in the selected embodiment.

Referring now to the drawings, anode member 1 comprises an outer ring 2 having a plurality of radially disposed vanes, alternately indicated as 3 and 3A, to define resonant cavities 11. As shown in Figure 3, an outer circular strap 5 is secured adjacent the inner ends to alternate vanes 3A. A second strap 4 is concentrically disposed to strap 5 and is secured to vanes 3. It will be observed that vanes 3 are cut-away as at 12 so as to clear strap 5, while vanes 3A are cut-away as at 13 to alternately clear strap 4. Between straps 4 and 5 the capacitance for the natural resonant frequency of the device is presented by gap 6. Since the straps may be considered as parallel plates of a capacitor, the device may be tuned by varying the capacitance.

Prior art methods of tuning include the introduction of additional capacitance in parallel to result in a variable capacitor. The use of metallic tuning members between the straps forms essentially two capacitors connected in series. Since the air gaps between the metal tuner and adjacent strap are exceedingly small, the total capacitance is relatively large and when added in parallel to the remaining original capacitance, the resonant frequency of the overall device is effectively altered.

Since it is evident that spacings between adjacent metallic components are small, problems exist in controlling tolerances, as well as, balancing the capacitance between resonant cavities to prevent unbalance of the electrical symmetry of the anode circuit.

I have discovered that a non-metallic tuning member 10 having a high dielectric constant is extremely useful in such tuning methods. According to the teachings of my invention I produce a varying capacitance by effectively increasing the total capacitance between the concentric straps as will be explained in the following equations and reference to Fig. 2.

Neglecting any stray capacitance of the anode vanes and fringe effects the capacitance between concentric straps without the tuner inserted may be calculated from the equation:

$$C_0=\frac{K}{18ln\frac{r_2}{r_1}\times 10^5}\text{ microfarads per cm. length}$$

where $K$=the dielectric constant, $r_2$=inner radius of the outer strap in cm., and $r_1$=the outer radius of the inner strap in cm.

With the insertion of the prior art metallic tuning member and a dielectric constant of 1.0 for air, the total capacitance equals:

$$C_0=\frac{1}{\frac{1}{C_1}+\frac{1}{C_2}}$$

where $$C_1=\frac{1}{18ln\frac{r_2}{r_a}\times 10^5}$$

and $$C_2=\frac{1}{18ln\frac{r_b}{r_1}\times 10^5}$$

where $r_a$=the outer radius of the tuning member, and $r_b$=inner radius of the tuning member.

The non-metallic tuning member of my invention, however, effectively introduces a third capacitor in series with $C_1$ and $C_2$ so that total capacitance now may be calculated from $$C_0=\frac{1}{\frac{1}{C_1}+\frac{1}{C_2}+\frac{1}{C_3}}$$

where $$C_3=\frac{9}{18ln\frac{r_a}{r_b}\times 10^5}$$

for a tuning member formed from alumina ($Al_2O_3$) having a dielectric constant of approximately 9.0.

The tuning member of the present invention may be controlled by the overall tuning structure shown by way of illustration in Fig. 1, however it may be pointed out that the invention is adaptable to any of the other known tuning structures. Tuning member 10 may be of a ceramic material such as alumina having a dielectric constant of approximately 9 or titania (titanium dioxide) having a dielectric constant of between 80–100 depending on the sources of supply. There are numerous other dielectric materials within this range that may be selected. Member 10 is secured to a carrier member 14 as at 17 by standard ceramic-to-metal sealing techniques such as the molybdenum-manganese or titanium hydride powder method. Carrier member 14 is provided with a step 8 which bears against cylinder 15. A stationary magnetic inner pole piece member 16 provides the other contacting surface for carrier 14. Adjustment of the travel of the tuning member is achieved by means of a threaded shaft 9. The tuning structure is further described in detail and claimed in the co-pending application of Richard S. Briggs, Serial No. 577,025, filed April 9, 1956, and assigned to the assignee of the present invention. This structure has been included in the present invention by way of illustration only and the claims as set forth in this application do not include any matter set forth in the aforementioned application.

In order to couple out power from the described anode structure 1 may, for example, introduce a wire loop through a groove 7 in outer ring 2 with the inner end of the loop secured to one of the vanes in the manner well known in the art.

Since a dielectric material has now been employed for the tuning member, any misalignment of this member will not cause any electrical shorting to the adjacent straps. Furthermore, the additional capacitance added to the resonant circuit has enhanced overall performance by permitting a wider tuning range to be attained. Compensation for unequal capacitances between individual resonant cavities has also been provided with the dielectric tuner which assures a balanced electrically symmetrical anode member.

What is claimed is:

1. In a capacitively-tuned magnetron comprising an anode structure having an outer ring member and a plurality of vane members radially disposed therein to define a plurality of resonant cavities, a first circular conductor electrically connected to alternate vane members at a point adjacent the inner ends, and a second circular conductor, of smaller diameter electrically connected to the remaining unconnected vane members to define with said first conductor a capacitance gap, a tuning member of a non-conductive dielectric material movable within said gap for altering the capacitance.

2. In a capacitively-tuned magnetron comprising an anode member having a plurality of radially disposed resonant cavities defined by metallic vane members, concentrically disposed metallic strap means electrically connecting alternate vane members and providing therebetween a capacitance, a tuning member of a dielectric material movable between said strap means to alter the capacitance.

3. In a capacitively-tuned magnetron according to claim 2, wherein said tuning member comprises a dielectric material having a dielectric constant value in excess of 1.0.

4. In a capacitively-tuned magnetron according to claim 2, wherein said tuning member comprises a body of a ceramic material having a high dielectric constant value.

5. In a capacitively-tuned magnetron according to claim 2, wherein said tuning member comprises a body of an alumina material having a dielectric constant of approximately 9.0.

References Cited in the file of this patent

UNITED STATES PATENTS

| | | |
|---|---|---|
| 2,422,465 | Bondley | June 17, 1947 |
| 2,449,794 | Steele | Sept. 21, 1948 |
| 2,485,084 | Brown | Oct. 18, 1949 |
| 2,629,068 | Gottschalk et al. | Feb. 17, 1953 |